(12) United States Patent
Saylani (10) Patent No.: US 12,304,541 B2
(45) Date of Patent: May 20, 2025

(54) STATION TIME, GRADE TIME, STOP TIME, AND RELAY TIME TESTING DEVICE

(71) Applicant: New York City Transit Authority, New York, NY (US)

(72) Inventor: Abdelaziz Saylani, Astoria, NY (US)

(73) Assignee: New York City Transit Authority, Brooklyn, NY (US)

( * ) Notice: Subject to any disclaimer, the term of this patent is extended or adjusted under 35 U.S.C. 154(b) by 850 days.

(21) Appl. No.: 17/532,303

(22) Filed: Nov. 22, 2021

(65) Prior Publication Data

US 2022/0161834 A1 May 26, 2022

Related U.S. Application Data

(60) Provisional application No. 63/117,389, filed on Nov. 23, 2020.

(51) Int. Cl.
*B61L 27/60* (2022.01)
*B61L 1/20* (2006.01)
*G01R 31/327* (2006.01)

(52) U.S. Cl.
CPC ............. *B61L 27/60* (2022.01); *B61L 1/20* (2013.01); *G01R 31/3278* (2013.01)

(58) Field of Classification Search
CPC .. B61L 27/60; B61L 27/53; B61L 1/20; B61L 1/181; G01R 31/3278
See application file for complete search history.

(56) References Cited

U.S. PATENT DOCUMENTS

| | | | | |
|---|---|---|---|---|
| 1,976,822 | A * | 10/1934 | Young | B61L 21/06 246/240 |
| 3,894,284 | A * | 7/1975 | Morrison | G01R 31/3278 178/69 R |
| 11,592,486 | B2 * | 2/2023 | Alnafi | H03K 17/18 |
| 2008/0288202 | A1 * | 11/2008 | Winkler | B61L 27/60 702/115 |
| 2010/0204857 | A1 * | 8/2010 | Forrest | B61L 27/57 701/19 |
| 2014/0365160 | A1 * | 12/2014 | Steffen, II | B61L 27/60 702/122 |
| 2022/0073116 | A1 * | 3/2022 | Pittman | B61L 1/20 |
| 2022/0363297 | A1 * | 11/2022 | Pittman | B61L 1/181 |

* cited by examiner

*Primary Examiner* — Zachary L Kuhfuss
(74) *Attorney, Agent, or Firm* — David Yee (57) ABSTRACT

The Station Time Grade Time Stop Time and Relay Time Testing Device (SGSRTD) is a portable device that allows one to test whether various railroad-based components and elements, circuits, controls, relays, and systems are operating optimally or pursuant to manufacturers' specifications. SGSRTD comprises a multitude of components, including a power switch, electronic programmable timers, connectors, shunt switch, DC relays, AC relay, and leads. When coupled with a limit switch, an SGSRTD system is formed.

16 Claims, 5 Drawing Sheets

STATION TIME, GRADE TIME, STOP TIME, AND RELAY TIME TESTING DEVICE

CROSS REFERENCE TO RELATED APPLICATIONS

This application claims the benefit of U.S. Provisional Application No. 63/117,389, to Saylani, filed Nov. 23, 2020, and entitled "Station Time, Grade Time, Stop Time, and Relay Time Testing Device", the entire contents of which are incorporated herein by reference.

BACKGROUND OF THE INVENTION

Railways use signaling systems to control the flow and timing of railcar movement along tracks and rail stations. Too often, these signaling systems are susceptible to failure. When a signal goes out, it can severely delay departure and arrival times.

Railway field personnel must frequently check on signaling systems to ensure they function properly. Current signal system testing equipment is inadequate because they tend to be complex and be configured to test only one specific aspect of a signaling system. To test other specific aspects, multiple, different testing equipment would have to be used.

Thus, what is needed is an easy, small portable tool that can test multiple aspects of the signaling system. It would also be ideal if such tool can wirelessly log and upload test data onto a desired computer system or cloud server in real-time.

BRIEF SUMMARY OF THE INVENTION

The present invention is a multifunction tool that tests railway time signals, controls, circuits, motors, interlockings, and relays.

DESCRIPTION OF EMBODIMENTS

The Station Time, Grade Time, Stop Time, and Relay Time Testing Device (SGSRTD) 101 is a device that comprises a multitude of components that advantageously allows it to test, whether in whole or in part, railroad-based components and systems. Examples include, but are not limited to, railway time signals, controls, circuits, motors, interlockings, and electromechanical relays. SGSRTD 101 may also test any electromechanical system of a relay-based circuit, a Solid State Interlocking based relay circuit, or any system that uses a relay-based circuit or stop motor hydraulic circuit. In addition, SGSRTD 101 may test inductive circuits or capacitor stop circuits. Tests performed may be aimed at determining whether or not the timing and/or functionality of any element, control, or circuit is operating optimally.

Figure 1:
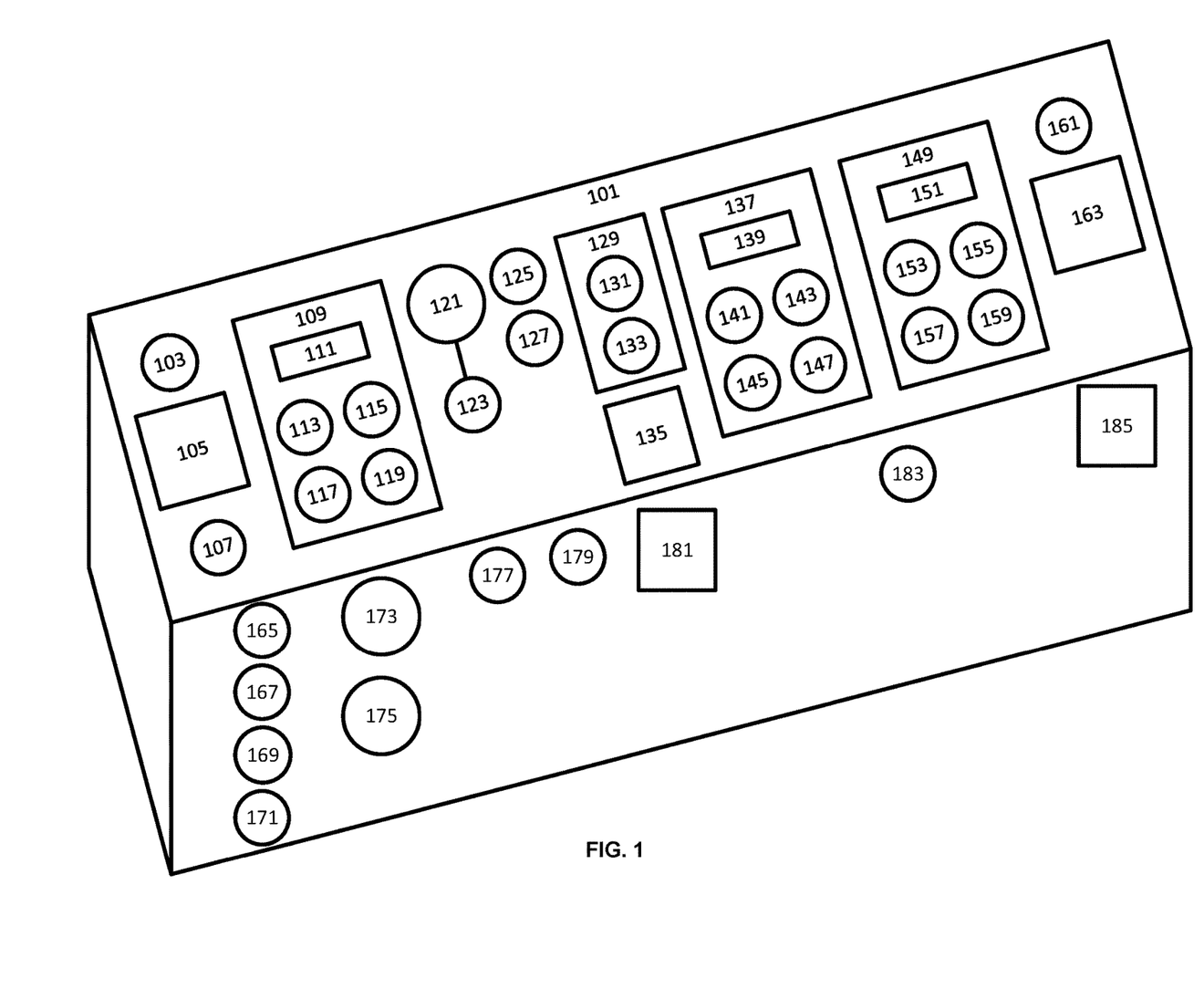
FIG. 1 illustrates SGSRTD as one aspect of the claimed invention.

SGSRTD 101 comprises 4 different units. These are an interface unit, shunt unit, stop unit, and limit switch unit. As a standalone device, as illustrated in FIG. 1, each of these units may be housed in one compartment.

As an embodiment and as illustrated in FIG. 1, FIG. 2, FIG. 3, and FIG. 4, SGSRTD components include a power switch 135, electronic programmable timers 105, 163, connectors, shunt switch 107, DC relays 201, 203, 205, AC relay 207, and leads.

The power switch 135 is the component that allows SGSRTD 101 to be powered on and off. The power switch 135 may be any kind of switch, such as a toggle switch, push button, rocker, or keylock. As an embodiment, the power switch 135 is a bat toggle switch rated to 277 VAC/20 A while being suitable for low DC voltage applications, such as 12 VDC and 24 VDC.

The power switch 135 may be coupled to a rechargeable battery 181, a 120 VAC power source, or both. As an embodiment, the power switch 135 may also be coupled to this spare rechargeable battery 185. Alternatively, the spare rechargeable battery 185 may just be housed on SGSRTD 101 without being coupled to the power switch 135. An advantage of supplying power via a rechargeable battery 181 is that it enables SGSRTD 101 to be portable. As an example, the rechargeable battery 181 is a 12 VDC Lithium-ion rechargeable battery pack 181 having an input voltage of 29.4V/0.7 A, a first output port of 24V with a voltage range of (29.4V-21V)/3 A maximum, a second output port of 12V/2 A maximum, a USB output at 5V/2A maximum, a USB-C output at 5V/3 A maximum, a multi-LED battery capacity indicator, and a power switch 135. The size of the first output port and the second output port each may be 5.5 mm×2.1 mm. The rechargeable battery 181 may be recharged using a 29.4V/0.7 A wall plug charger.

SGSRTD 101 may also be powered by an auxiliary source (e.g., a separate battery, generator, etc.). To receive auxiliary power, a positive connection from the auxiliary source may be connected to SGSRTD's auxiliary positive input 177, and a negative power connection from the auxiliary source may be connected to SGSRTD's auxiliary negative input 179.

As a safety measure, SGSRTD 101 may incorporate a current trip 183. When activated, the current trip 183 may shut off power to the SGSRTD 101 by overloading a relay.

SGSRTD 101 requires at least two electronic programmable timers 105, 163. Each electronic programmable timer 105, 163 work independently of each other and may be configured to run at the same time. Each electronic programmable timer 105, 163 may be an electronic, digital preset counter with two or more presets and two or more display counters, such as the product 924K sold by the company Kessler-Ellis Products.

A first timer 105 (also referred to as Station Time/Grade Time timer or ST/GT timer) may be configured to test how long it takes a circuit to run a complete cycle. This length of time is referred to as "first timer delta time". For example, a complete cycle may the time difference at the moment a track circuit is shorted to when the stop arm moves into a cleared position. Once the first timer delta time is known, it may be used to determine the railway time signal's operational effectiveness when compared to acceptable state transition time differentials within railway industry standards.

Railcar may be either a single powered rolling stock or a train comprising at least two connected rolling stock with the lead rolling stock as a powered rolling stock. Nonlimiting examples of powered rolling stock include locomotives and subways. Nonlimiting examples of rolling stock that is not powered include flat cars, box cars, and tank cars.

A second timer 163 (also referred to as Stop/Relay timer) may be configured to test a stop circuit (also referred to herein as a stop motor circuit), relay-based circuit (e.g., a max 120 VAC/30 VDC relay-based circuit), an electromechanical relay, or any electromechanical relay-based system. Time results from tests using the second timer 163 may be referred to as "second timer delta time." Second timer delta time may indicate how long it takes for a stop circuit to energize a stop arm (i.e., place the stop arm in a cleared position). Cleared position refers to the stop arm being in a particular position (e.g., lowered position) so as to allow a railcar to avoid coming into contact with the stop arm upon passage and causing the railcar to stop. Second timer delta time may also be used to determine how long it takes for an energized stop arm to return to a de-energized state (i.e., tripping position) when power being supplied by the railway time signal is interrupted or reduced to a threshold below what is minimally needed to maintain the stop arm in an energized state. Tripping position refers to the stop arm being in a particular position that will come into contact with a railcar and force a railcar to stop upon contact.

The railway time signal (also known as a block signal) is a signal that is electronically coupled to a track section (also known as a "block" or "track block") as part of a track circuit, configured to operate in conjunction with a stop circuit, and uses one or more internal timers to govern when a railcar is permitted to enter or occupy a block.

Figure 3:
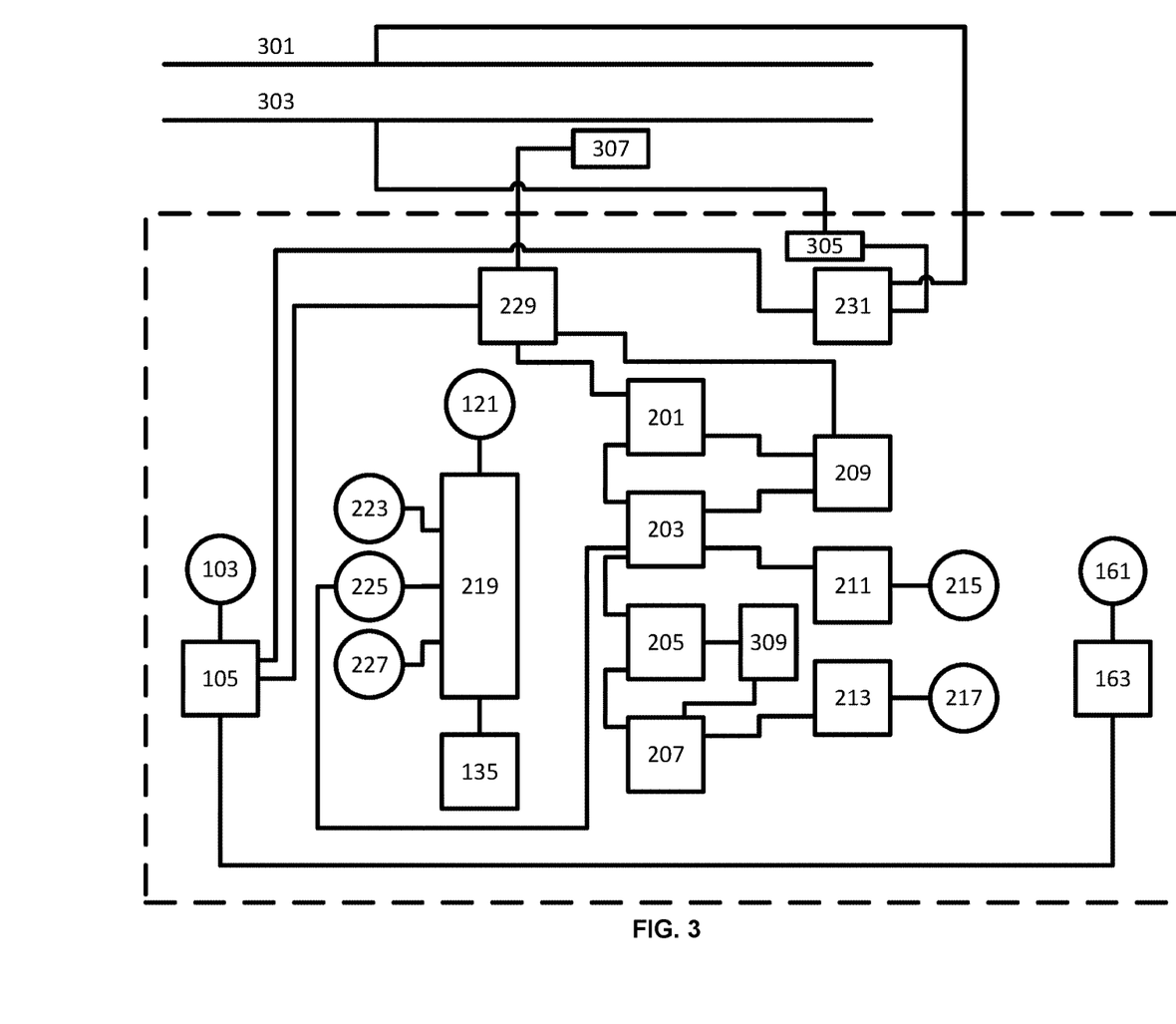
FIG. 3 illustrates the application of SGSRTD at rails as another aspect of the claimed invention.

The track circuit is an electrical circuit located within an area of a track section that is separated by insulated joints between rails. This circuit is generally formed by running low current from a power source and along one rail of a track section ("signal rail") 303 to a track circuit relay and then returning the current back to the power source along the opposite rail of the track section ("negative rail") 301.

The stop circuit is an electromechanical circuit powered by a power source and connected with a railway time signal, at least one stop circuit relay, and at least one mechanical stopping device. The power source may be configured to run low voltage to and from the railway time signal, through the stop circuit relay, to the mechanical stopping device.

The stop circuit may be AC and/or DC voltage driven. For instance, in the case of an inductive or capacitor stop, AC predominates and takes over DC. For an Air Stop, both AC and DC will drive air to the compartment of the Air Stop since it uses either an AC or DC magnet.

When the track section is unoccupied, the track circuit should be a complete circuit. The track circuit relay may be energized. In turn, the energized track circuit relay may keep the railway signal clear (i.e., the track is unoccupied). The railway time signal may display a clear signal (e.g., proceed, proceed with caution, or an equivalent message indicating a railcar may proceed).

Similarly, when the track section is unoccupied, the stop signal should be a complete circuit. The stop circuit relay may be energized. In turn, the energized stop circuit relay may also keep the railway signal clear and may keep the mechanical stopping device in the clear position. The railway time signal may display a clear signal (e.g., proceed, proceed with caution, or an equivalent message indicating a railcar may proceed).

When a railcar or a foreign object occupies the track section, it should short the track circuit and/or the stop circuit. This circuit shorting, also referred to as "shunting" the circuit, may occur where the metallic wheels and/or axles of the railcar, or something metallic from the foreign object, cuts off or diverts current away from the relay. As a result, the track circuit relay may become de-energized, which causes the railway time signal to indicate that the track section is occupied by changing at least one indicator (such as color, color combination, light placement, etc.). Simultaneously, the stop circuit relay may also become de-energized, cause the railway time signal to change at least one indicator to signify the track is occupied, and cause the mechanical stopping device to be in the tripping position. The railway time signal may display a stop signal (i.e., stop or an equivalent message informing the railcar to stop). An internal timer of the railway time signal may begin counting the time it takes for the railcar to arrive at the railway time signal. The longer the internal timer runs, the slower the railcar is traveling. Using this time as data, the speed of the railcar may be calculated. If the railcar arrives at the railway time signal before the time on the internal timer expires, the railcar is traveling too fast. If so, the railway time signal should remain a stop signal.

As an embodiment, the mechanical stopping device is a stop arm. A stop arm (also known as a trip arm or railcar stop) is a mechanical device that is generally mounted to the ground adjacent to a rail. The stop arm may be spring-loaded and connected to an electric motor. Alternatively, the stop arm may be spring-loaded and connected to a pneumatic cylinder.

In the tripping position, the stop arm is raised to a level above the top of the adjacent rail. If a railcar fails to stop while the stop signal is displayed and attempts to proceed past the stop signal, the stop arm may trip the railcar (i.e., force the railcar to immediately stop). Tripping occurs when a railcar's tripcock comes in contact with the stop arm. A tripcock is a mechanism mounted on a railcar that is either connected directly or electrically to the railcar's braking system.

If the railcar arrives at the railway time signal on or after the time on the internal timer expires, the railway time signal is cleared (i.e., message indicating that it is safe to proceed). Once the railcar safely proceeds and no longer shunts the track circuit and stop circuit of the track section, several things are expected to occur. The track circuit may be a complete circuit again, the track circuit relay may be re-energized, and the track section should indicate that it is unoccupied. Likewise, the stop circuit may be a complete circuit again, the stop circuit relay may be re-energized, and the stop arm may be lowered again. In turn, the railcar may pass over the lowered stop arm without having a mounted tripcock come in contact with it.

As an embodiment, the railway time signal may be a signal equipped with a Station Time (ST) control, a signal equipped with a Grade Time (GT) control, or a signal equipped with both ST control and GT control (ST/GT). ST control is a signal control that enables a second railcar to slowly approach a first railcar occupying a track section or a railcar station, so long as the second railcar travels at a significantly reduced speed. GT control is a signal control that enforces a railcar speed limit that a railcar must travel at or under along a curve or during a change in elevation before the GT control can clear and allow the railcar to proceed.

Figure 2:
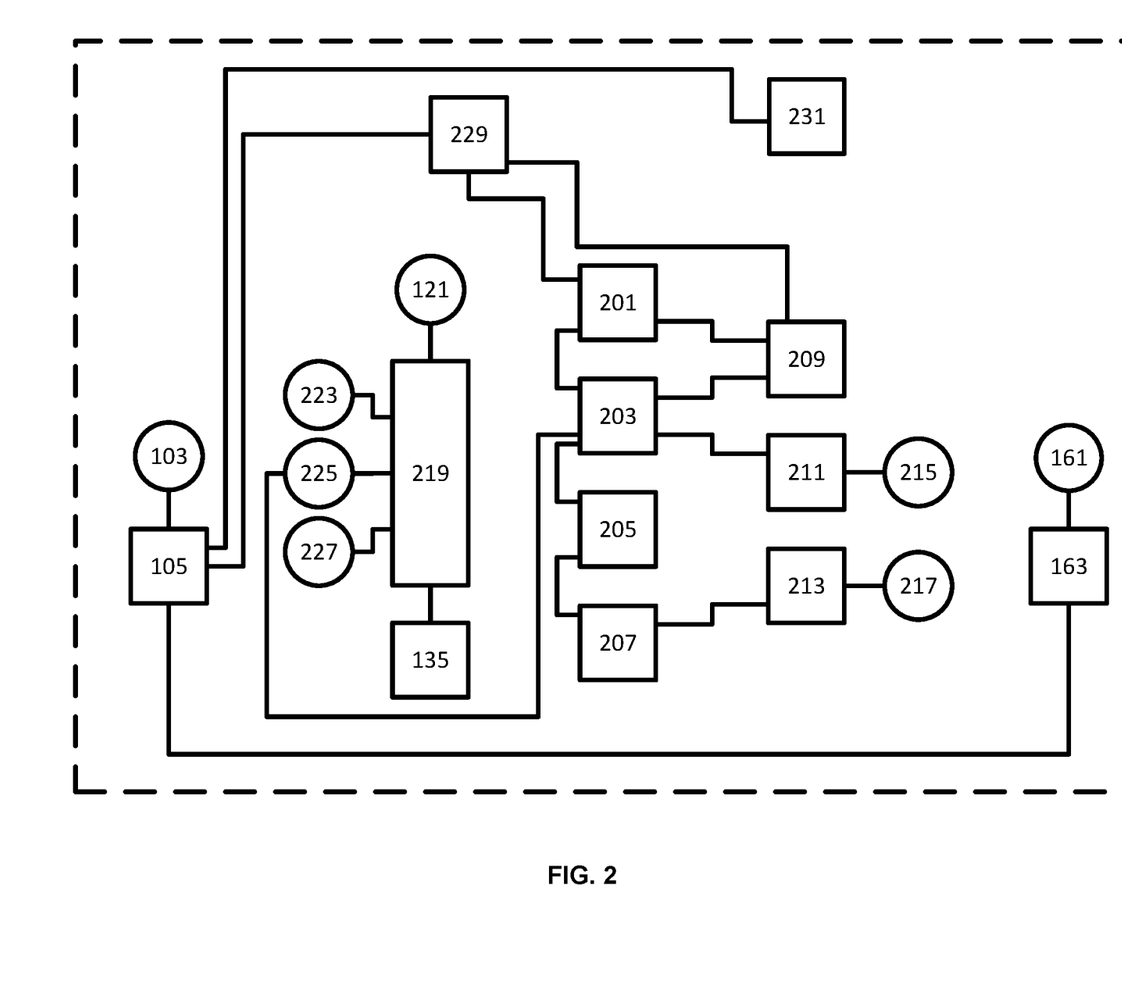
FIG. 2 illustrates the application of SGSRTD at rails as one aspect the claimed invention.

A limit switch 229, while not a direct component of SGSRTD, is vital to SGSRTD and its testing capabilities. When coupled and connected to SGSRTD, it creates an SGSRTD system with all the SGSRTD components described herein that enables SGSRTD to perform tests, whether separately or in combination, on various kinds of circuits, relays, controls, signaling elements, railroad-based components, etc.

The limit switch 229 is a contact sensing component that detects the presence or position of an object upon the object's contact on the limit switch's actuator 307. The limit switch 229 may be connected, preferably in series, to the first timer 105 and second timer 163.

As an embodiment, the limit switch 229 may have a standard roller lever actuator 307, a rated operational voltage of 600 VAC and 250 VDC, a rated operational current of 1.2 A and 0.1 A, and an operating temperature of up to −40° C. to up to 121° C. An example of one is the product Micro Switch Heavy-Duty Limit Switch HDLS Series sold by the company Honeywell.

The limit switch 229 may have both normally open (N.O.) contacts 169, 171 and normally closed (N.C.) contacts 165, 167. The N.O. contacts may be connected to at least one first light 223 in SGSRTD 101 to indicate whether a mechanical stopping device is activated or driven (i.e., in the tripping position), to at least one second light 125, 225 in SGSRTD 101 to indicate whether the mechanical stopping device is in the clear position, and to at least one third light 127, 227 in SGSRTD 101 to indicate whether the mechanical stopping device is malfunctioning or in a danger position (such as partially driven but not fully driven or partially clear but not fully clear). The N.C. contacts enable or disable the first timer 105 and second timer 163.

The limit switch 229 may be connected to SGSRTD 101 using a cable lead and a connector. This connector is to be inserted into at least one SGSRTD limit switch connection port. SGSRTD 101 may have a primary SGSRTD limit switch connection port 173. SGSRTD 101 may also have an auxiliary SGSRTD limit switch connection port 175.

As an embodiment, the connector is waterproof, has 4 contacts, has an operating voltage of 500 VAC, has a current rating of 20 A, and a temperature rating of up to −40° C. to up to 80° C., An example of one is the product YM-20 sold by the company Cnlinko.

It is absolutely necessary that there be a connector connected to an SGSRTD limit switch connection port 173 or 175 in order for the SGSRTD 101 to work. The preferable embodiment is that the connector is attached to a cable lead connected to the limit switch 229. However, alternatively, the connector can also be a stand-alone plug (i.e., without anything else attached to it except for its connection in the SGSRTD limit switch connection port 173 or 175). SGSRTD 101 is designed specifically this way as a self-check tool to prevent wrong data collection and to allow a user to understand in advance what may be wrong with SGSRTD 101 if it malfunctions.

The shunt switch 107 is a component that is configured to simulate a railcar entering or occupying a track section by short circuiting (or "shunting") a track circuit. It may also be configured to simulate the shunting of any other circuit (such as a railway time signal, stop circuit, etc.).

Like the power switch 135, the shunt switch 107 may be any kind of switch, such as a toggle switch, push button, or rocker. As an embodiment, the shunt switch 107 is a bat toggle switch rated to 277 VAC/20 A while being suitable for low DC voltage applications, such as 12 VDC and 24 VDC.

Two separate and distinct, cable leads may be coupled to the shunt switch 107. As an embodiment, each cable lead may be a fused isolation lead. One end of a first shunt lead is to be connected to an SGSRTD first shunt connection port, which is coupled with the shunt switch 107, the first timer 105, and the second timer 163. The other end of the first shunt lead is to be connected to a first clip (e.g., an alligator clips, clamps, etc.). The first clip is to come in contact with a first rail that is coupled to a circuit (e.g., track circuit, railway time signal, stop circuit, etc.).

Similarly, one end of a second shunt lead is to be connected to an SGSRTD second shunt connection port, which is also to be coupled to the shunt switch 107, the first timer 105, and the second timer 163. The other end of the second shunt lead is to be connected to a second clip (e.g., an alligator clips, clamps, etc.). The second clip is to come in contact with either the signal rail 303 or a negative rail 301, depending on how and where the circuit is wired, to allow for shunting to occur.

To shunt a track circuit, stop circuit, or any other kind of circuit, it is preferable that the first shunt lead and the second shunt lead be connected to parts of a circuit prior to turning on the power switch 135. Once SGSRTD 101, the first timer 105, and second timer 163 are powered, shunting may proceed by simply flipping, turning on, pressing, or enabling the shunt switch 107. The first timer 105 and second timer 163 should begin counting time until an object, such as an activated stop arm, comes in contact with the limit switch's actuator 307.

However, SGSRTD 101 can still operate where the reverse procedure occurs. That is, the power switch 135 is first turned on before the first shunt lead and second shunt lead are connected to a circuit, followed by engaging the shunt switch 107 in the on position. In either event, SGSRTD 101 provides for a switch for shunting that is separate and apart from the power switch 135 as a necessary safety measure to help protect a user against electric shock.

SGSRTD 101 comprises at least two DC relays 201, 203. A first DC relay 201 may be connected in series with the limit switch 229 and the first timer 105. The first DC relay 201 may also be connected to a dry contact 133 or 209 of a stop circuit to allow for the testing of at least one railway time signal and/or stop circuit. In addition, the first DC relay 201 may be connected to a second DC relay 203 and/or an AC relay 207.

The AC relay 207 may be used to trigger the stop timer 163 when AC energy is received from a stop motor circuit. When the front contact of the AC relay 207 is closed, the normally closed (N.C.) contact should open, the normally open (N.O.) contact should close, and the stop timer 163 should start counting until the limit switch 229 is pressured. This process will happen only when the stop arm of the stop motor circuit is driven to the clear position. The test unit 101 may be used to make sure the timer, whether it be an electromechanical timer or a solid state interlocking timer, that is implemented inside the logical software circuit is set to the correct value to ensure proper operation of the clearing of the signaling system. Being set to the correct value is necessary for avoiding train service delays.

A second DC relay 203 may be coupled to, and activate, at least one light 223, 225, 227 connected to SGSRTD 101 via a terminal distribution block 219. A first light 223 may indicate a successful operation or completed test. A second light 225 may indicate an error or malfunction. A third light 227 may indicate caution, warning, or testing is being conducted. The second DC relay 203 may also be connected to an optional RVP 131. An RVP is a reverse stop repeater relay that indicates when a stop arm is in a tripping position or in a clear position. When the RVP is energized, the RVP's front contact closes, which means the stop arm is in the clear position. The RVP 131 may be located on a contacts section 129 of SGSRTD 101.

Where additional DC relays 205 are preferred, they may be installed on SGSRTD 101 to operate, control, or engage with different or other stop circuits, such as Air Stops and stop magnets, inductive stop circuits, and capacitor stop circuits.

An Air Stop is a hydraulic-based circuit that uses air coming from a compressor room. Where Air Stops use DC voltage, the additional DC relay 205 may provide normally open (N.O.) and normally closed (N.C.) contacts to obtain the minimum voltage necessary to activate the second timer 163.

N.O. and N.C. are terms used to define a functional operational circuit. N.O is the normal position of the circuit when it is de-energized. N.C. is the normal position of the circuit when it is energized.

The stop magnet is the control circuit for an Air Stop. It is energized using 18 to 24 VDC. If the magnet is closed, air will flow to the stop compartment and push a piston to move the arm of the stop circuit to either a tripping or clear position.

SGSRTD 101 may also comprise at least one AC relay 207. The AC relay 207 may provide contacts to the stop circuit to allow for the second timer 163 to run and for the triggering of points (e.g., the gate, ground, etc.) on the second timer 163. The AC relay 207 may be energized when the stop circuit receives 120 VAC energy. Once energized, the AC relay 207 should close its back contact, triggering the starting point of the stop timer 163, and become N.C.

SGSRTD 101 may comprise an AC digital voltmeter 217 coupled to the AC relay 207 to calculate the amount of voltage being supplied to SGSRTD 101. SGSRTD 101 may also comprise a DC digital voltmeter 139, 215 coupled to at least one DC relay 201, 203, 205.

As an embodiment, SGSRTD 101 may include an AC/DC converter, which may be coupled to at least one DC relay 201, 203, 205, and the AC relay 207, the AC digital voltmeter 151, 217, and/or the DC digital voltmeter 139, 215.

The AC/DC converter may be used when testing involves a stop motor operating under DC. For example, DC energy may predominate when a DC magnet or low AC current is used. The AC/DC converter may also allow for the testing of AC relays, DC relays, and/or DC stop motor's magnet, as well as various circuits, including but not limited to stop circuits.

The AC and DC voltmeter may be used to indicate whether there is sufficient energy being supplied to the AC or DC stop motor. Sufficient energy is a prerequisite for proper operations of a stop motor so that data may be collected and validated.

SGSRTD 101 may comprise a safety warning device, such as a strobe light 121 and/or alarm, to alert oncoming railcars, vehicles, or personnel that some object and/or person(s) is present in the area and may be impeding pathway. In an embodiment, using a coupling 123, SGSRTD 101 may couple a strobe light 121 via a terminal distribution block 219 to the power switch 135. The strobe light 121 may be a red strobe light 121 with an operating voltage of about 6-24 VDC, a current draw of 200 mA±20% @ 12 VDC, a flash rate over 90/min @ 12 VDC, and an operating temperature of about −22° F. to about 140° F. (about −30° C. to about 60° C.). In yet another embodiment, where an alarm is incorporated, the alarm may emit or project a sound of at least 75 decibels.

SGSRTD 101 may comprise at least two separate and independent reset or clearing components 103, 161. One is coupled to the first timer 105. The other is coupled to the second timer 163. Each may be a push button or any kind of switch to enable the first timer 105 and the second timer 163 to be reset to 0, or to clear the reading on either or both timers. Each reset component 103, 161 enable its respective associated timer the capability to restart the testing the timing section. Until the reset component for a respective timer is pressed or activated, the last data reading for that timer is retained.

Additionally, the first timer 105 and the second timer 163 are each capable of retaining its respective last data reading in the event SGSRTD loses power.

SGSRTD 101 may monitor loads intrusively or non-intrusively. For nonintrusive load monitoring, SGSRTD 101 may incorporate at least two current transducers. A first current transducer may be coupled to the lead that is connected to the signal rail 303. When current running along the signal rail 303 is shunted, the first current transducer 231 may close its normally open (N.O.) contacts and open its normally closed (N.C.) contacts. This closure may immediately start the running of the first timer 105. As an embodiment, the first current transducer 231 may have an operating amperage range of about 0.25 A to about 200 A, an isolation voltage of about 600 VAC rms, and a trip setpoint value of about 0.25 A, such as the product CSD Series Current Device (e.g., CSD-SF0C0-1) sold by the company Johnson Controls. The first current transducer 231 may be coupled to a voltmeter 305.

Non-intrusive load helps avoid wiring connection interference or disconnections, and/or disrupting normal operations of the stop circuit. By not having to disconnect wires from a stop circuit and then having to use an open loop current transducer, test runs may be conducted safely.

A second current transducer may be coupled to the lead that is connected to the stop motor circuit. Upon sensing current running through the stop motor circuit, the second current transducer may close its N.O. contacts, open its N.C. contacts, and thus immediately start the running of the second timer 163. As an embodiment, the second current transducer may have an amperage range of about 0.15 A to about 60 A with its N.O. contacts activating at about 0.15 A or less, such as the product HX00 Series (e.g., H300) sold by the company Veris. The second current transducer may also be coupled to a voltmeter.

These leads, whether coupled to the signal rail or stop motor circuit, are exchangeable. They may be used to measure voltage or current. They may also be used to test the circuit.

At least one thermal circuit breaker may be incorporated in SGSRTD 101 to protect SGSRTD 101 and personnel from electric overload and short circuiting. Current rating may range from 1.0 A to 35.0 A. For about 1.0 A to about 4.0 A, trip times may range from no trip at 100% rated load, to between about 0.50 seconds and about 3.4 seconds at 1000% rated load. For about 5.0 A to about 35.0 A, trip times may range from no trip at 100% rated load, to between about 0.15 seconds and about 0.64 seconds at 1000% rated load. Maximum resistance may range from about 1.35 Ohms to about 0.020 Ohms.

The SGSRTD 101 may incorporate at least one capacitor stop 211, 213.

The SGSRTD 101 may include a wireless network adaptor to enable real-time data transfer over WiFi. Examples include, but are not limited to, 802.11 a/b/g/n/ac adaptors and Wi-Fi X USB adaptors (where X denotes a number, such as 6 or 5). These examples can run on either 2.4 GHz or 5 GHz.

The SGSRTD 101 may include a data logger to collect data in real-time. The data logger may be wireless or wired. The data logger may be capable of recording, collecting, monitoring (via meters), and compiling data (such as AC voltage, DC voltage, current values, etc.). This data may either be stored on the data logger or transferred through a wired connection, or wirelessly through the wireless network adaptor, to a computer-readable storage media (e.g., hard drive, solid state drive, thumb drive, CD, a computer with a memory, smartphone, etc.) or the cloud. Data may be configured to be readable using a computer-based software such as Excel. Examples of data loggers include product NI 9219 and product NI 9242, both sold by the company National Instruments.

Figure 4:
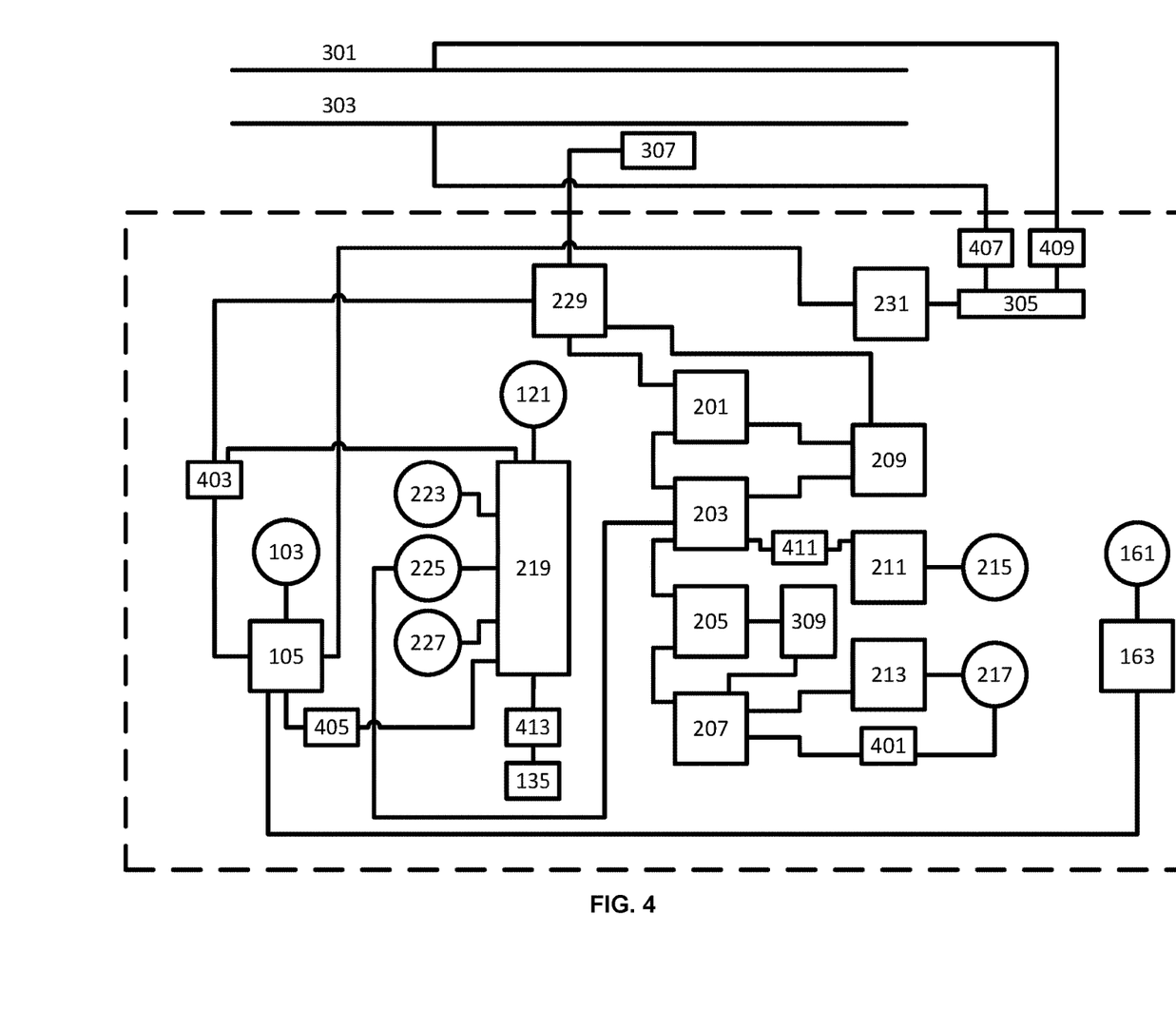
FIG. 4 illustrates the application of SGSRTD at rails as yet another aspect the claimed invention.

Throughout SGSRTD 101, fuses 401, 403, 405, 407, 409, 411, 413 may be incorporated. However, not all of these fuses must be used. SGSRTD allows for none or one or more fuses to be used.

SGSRTD ST/GT Testing and Stop Circuit Testing

As one aspect of the present invention, three connections with SGSRTD 101 are set up to simultaneously test the ST/GT time signal and stop circuit. The first connection to SGSRTD 101 is the limit switch 229. Using a cable lead, one end is connected to the limit switch 229. The other end of the cable lead, coupled with a connector, is connected to the SGSRTD limit switch connection port 173 or 175. The limit switch 229 may be placed at about 2 inches below the rail coupled with a railway time signal and within proximity of a stop arm, wherein the stop arm upon activation may contact and apply pressure to the limit switch's actuator 307.

The second connection to SGSRTD 101 is the shunt switch 107. Shunting is necessary to both simulate a train on the track circuit and to start the timing process of the first timer 105. As an embodiment, this connection uses two separate cable leads. One end of a first cable lead may be connected to the SGSRTD first shunt connection port 113, 115 and the other end may be connected to a signal rail 303. One end of a second cable lead may be connected to the SGSRTD second shunt connection port 117, 119 and the other end may be connected to a negative rail 301. As an embodiment, the first cable lead may be a fused isolation cable lead, and the second cable lead may be a fused isolation cable lead.

Both the SGSRTD first shunt connection port 113, 115 and the SGSRTD second shunt connection port 117, 119 are part of a VAC section 109 of SGSRTD 101. The VAC section 109 may comprise a VAC signal data logger (i.e., voltage signal data logger for AC) 111.

The third connection to SGSRTD 101 may be an intrusive connection that is wired serially from the second timer 163 to the stop circuit to calculate the second timer delta time. One cable lead ("BX lead"), serving as a hot wire (e.g., positive AC), may be used to connect the SGSRTD BX connection port 153, 155 with an element of the stop circuit (e.g., stop motor) supplying voltage to the stop circuit. A second cable lead ("CX lead"), serving as a neutral wire (e.g., common AC), may be used to connect the SGSRTD CX connection port 157, 159 with a ground element of the stop circuit. As an embodiment, the BX lead may be fused cable lead, and the CX lead may also be a fused cable lead.

Alternatively, the third connection to SGSRTD 101 may be a nonintrusive connection. For a nonintrusive connection, a current probe or a split core current transducer, coupled to SGSRTD 101, may be placed around the cable lead connected to the BX energy coming from the stop circuit.

When all connections are in place, SGSRTD 101 may be powered on. Upon powering, a warning mechanism, such as a strobe light 121 and/or an alarm, may be activated. The shunt switch 107 may then be turned on. Once turned on, it may trigger the first timer (ST/GT) 105 to start counting. The first timer runs independently and regardless of whether the stop circuit is or has been activated.

An internal timer (which may be set to a control line speed and distance within a track) of the control line section of the track circuit being shunted may run. After the internal timer times out, a DC relay of the control line circuit of the track circuit may apply voltage to the stop motor and activating the second timer (Stop/Relay timer) 163 (i.e., triggering the time counting) and the stop arm. Once the stop arm drives and comes in contact with the limit switch's actuator 307, the stop arm is in the clear position; both the first timer 105 and the second timer 163 should stop counting time.

The time reading (or data value) from the first timer 105 (which may be referred to as the "first timer delta time") is the overall time from when shunting begins to when the stop arm is in the clear position. Comparing the first timer delta time against the expected operating time for the circuit is useful for determining whether the circuit is operating properly or timely, or needs maintenance. For example, if the actual operating time of a stop or relay circuit is supposed to be about 500 mSecs to 1.200 Sec, but SGSRTD obtained a higher first timer delta time (e.g., 1.500 Sec or 2.000 Sec), the stop motor may be experiencing a mechanical failure or may need lubrication. In the case of an air stop motor circuit, possible issues include insufficient air pressure or low voltage.

The time reading (or date value) from the second timer 163 is the overall time from stop motor activation to stop arm clearance (i.e., the stop arm being in the cleared position by coming in contact with the limit switch's actuator 307). This time reading (also referred to as the "second timer delta time") may be used to determine whether the stop circuit and/or stop motor is operating properly in accordance with the manufacturer's specifications or whether the stop circuit and/or stop motor needs maintenance.

Both Overall Delta Time and second timer delta time are critical. Not only do they provide data in verifying whether a circuit is operating timely, but they also indicate whether the timing section is correctly set to allowable train speed and safety operations.

SGSRTD Stop Circuit Testing

As another aspect of the present invention, SGSRTD 101 may be used to only test a stop circuit. Stop circuit testing begins when energy is supplied to the stop motor circuit and ends when the stop arm is in the clear position. In such desired test, only two connections may be needed. Serving as the stop for the stop timer 163, the first connection may be the limit switch 229. Serving as the trigger for the stop timer 163, the second connection may either be an intrusive connection to the stop circuit or a nonintrusive connection to the stop circuit. The same cable leads as described above may be used. For this embodiment, the shunting connection is not necessary and may be disengaged from SGSRTD 101.

SGSRTD Relay Testing

SGSRTD 101 may be used to test DC relays and AC relays to determine whether they are working properly. When testing a DC relay, at least two connections may be needed. For DC relays, two cable leads may be placed at (1) the LB/LC or VB/VC connection points on a relay coil, and (2) the corresponding SGSRTD LB/LC or VB/VC connection ports 141, 143/145, 147 (respectively), which may be coupled with the second timer 163. LB/LC is the DC energy from the rectifier that supplies energy to DC relays or the stop motor DC Magnet. VB/VC is the supply energy from batteries of at least one DC relay-based circuit. The DC relay-based circuit may be located, for example, in a signal room. Each cable lead may be a fused cable lead.

The corresponding SGSRTD LB/LC or VB/VC connection ports 141, 143/145, 147 (respectively) may be part of a VDC section 137 of SGSRTD 101. The VDC section 137 may comprise a DC digital voltmeter 139, 215 to allow a user to visually gauge and track how much DC energy is being used or applied. The VDC section 137 may be rated at or about 6 to at or about 12 VDC.

When testing an AC relay, at least two connections may be needed. For AC relays, two cable leads may be connected to the connection points or dry contacts with one fused cable lead end connected to the SGSRTD BX connection port 153, 155 and the other fused cable lead end connected to the SGSRTD CX connection port 157, 159. BX is the supply AC energy of the stop motor circuit, as well as AC relays. CX is the return path of the current for the stop motor circuit, as well as AC relays. Each cable lead may be a fused cable lead.

The SGSRTD BX connection port 153, 155 and SGSRTD CX connection port 157, 159 may be part of a VAC section 149 of SGSRTD 101. The VAC section 149 may comprise an AC digital voltmeter 151, 217 to allow a user to visually gauge and track how much AC energy is being used or applied. The VAC section 149 may be rated at or about 110 VAC.

Note that SGSRTD will always be triggered (i.e., activate) whenever AC or DC energy is being supplied from a stop motor or relay-based circuit.

When testing any DC relay or AC relay, neither the limit switch 229 nor the shunt switch 107 is needed. However, a second connection (i.e., a connection to the SGSRTD limit switch connection port 173 or 175) is still required in order for SGSRTD 101 to work. In one embodiment, a limit switch cable lead with a connector may be connected to the SGSRTD limit switch connection port 173 or 175. In another embodiment, in lieu of the limit switch cable lead, a connecter, serving as a jumper and without any connection to a cable lead, may be connected to the SGSRTD 101 where the limit switch cable lead would generally be connected. In effect, this connection may be viewed analogously as a safety key that, when plugged in, allows SGSRTD 101 to operate. The purpose of such design is to prevent wrong data collection and to allow for test engineers or maintenance personnel to understand in advance what may be wrong with SGSRTD 101 if SGSRTD 101 fails to operate or malfunctions.

When voltage is applied thru the relay's coil, the second timer 163 begins counting until one or more contacts from the relay being tested is closed. Upon closure, the second timer 163 may cease counting time. The result should be near the posted time of a relay within an acceptable standard deviation. Timewise, if such a case arises, the tested relay may be deemed to be operating correctly. Otherwise, the tested relay may be deemed as faulty.

Relay testing uses the same first timer 105 and second timer 163 as the stop circuit testing. The timers generally start timing when a relay coil is energized (i.e., receiving voltage). The timers generally stop timing when a relay's front or back contact closes. The time reading is the delta time interval. The delta time interval may be compared against a manufacturer's specification listing of a relay to determine whether the test relay is operating correctly/timely or incorrectly/showing a delay/malfunctioning.

SGSRTD Flow Chart

Figure 5:
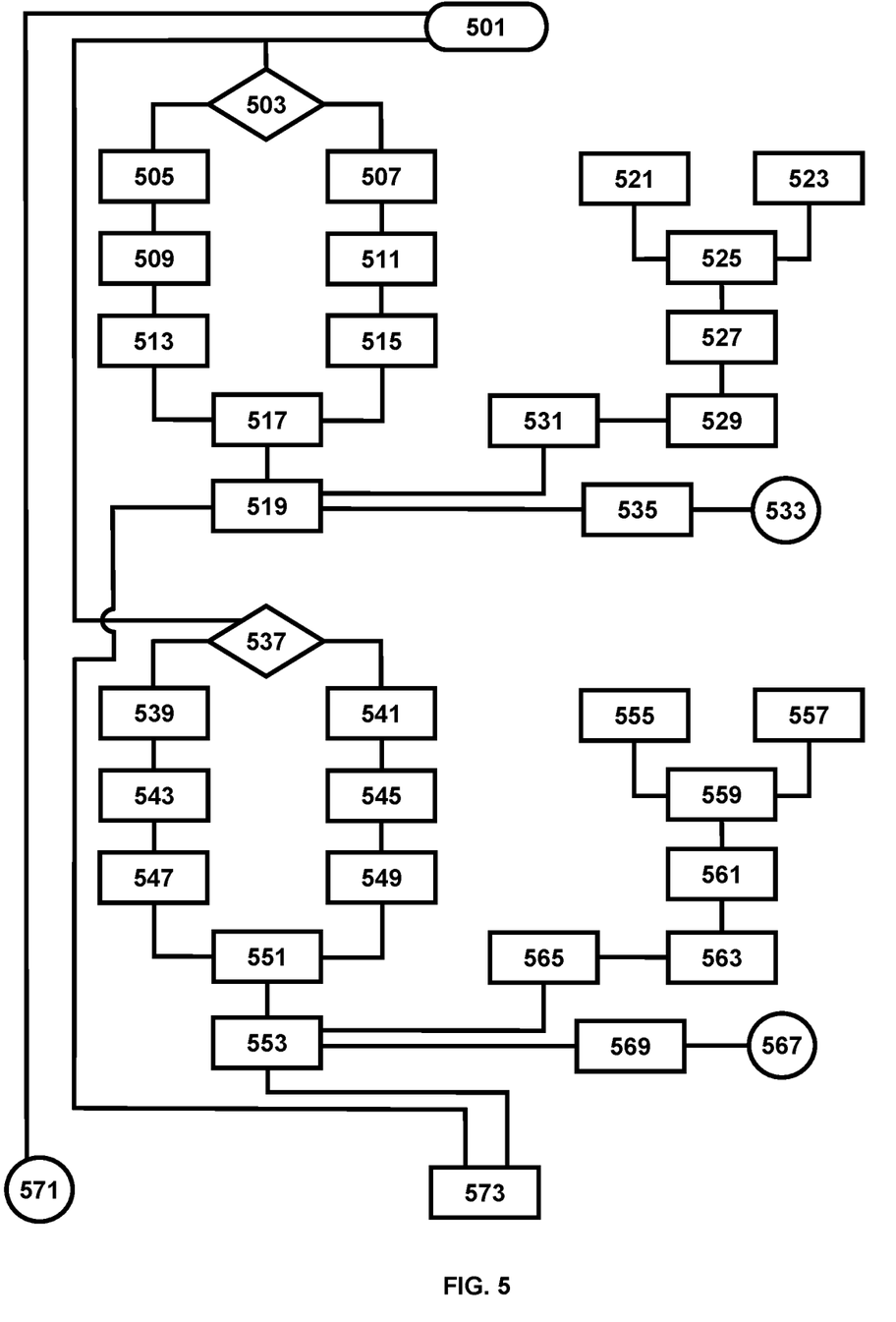
FIG. 5 depicts a flow chart of the SGSRTD activation and testing process.

FIG. 5 shows an example of how SGSRTD may operate. SGSRTD must first be powered on 501. Upon powering 501, the strobe light 571 should be activated.

On the shunting portion of SGSRTD, energy should flow through the shunt leads to a shunt connected on the rails 503. Along the signal rail side, energy may continue to flow through the shunt 505, then to a limit microswitch normally closed contact (LMS-NCC) 509, and to Station Grade Gravel pin 2 (SGG2) 513. Along the negative rail side, energy may continue to flow through the shunt 507, then to a DC relay normally closed contact (DCR-NCC) 511, and to Station Grade Gate pin 7 (SSG7) 515. Energy from both may converge at a trigger 517. Upon activating the trigger 517, the Station Time, Grade Time Digital Internal Timer (STGT-DIT) 519 may begin counting. As it counts, SGSRTD should be working 573.

To stop counting on the shunting portion of SGSRTD, a Direct Current Trigger (DCT) (which may be an internal relay that helps start and stop the timing) 523 and a limit microswitch normally open contact (LMS-NOC) 521 may be engaged to cause a stop 525. In turn, a signal should be sent to the DC relay normally open contact (DCR-NOC) 527 to put the SGG2 and SGG7 in an open position 529. As a result, a stop 531 should occur, causing STGT-DIT 519 to stop counting. To reset 535 the STGT-DIT, the Station Time Grade Time (ST/GT) Reset 533 may be contacted.

Additionally, to test a stop motor (SM), upon powering 501, energy should also flow through the lead wires connected to a stop motor (SM) circuit 537. Along the SM energy (SME) side 539, energy may continue to flow to an LMS-NCC 543, and then to SGG2 547. Along current stop motor (CTSM) side 541, energy may continue to flow to a DCR-NCC 545, and then to SSG7 549. Energy from both may converge at a trigger 551. Upon activating the trigger 551, the Stop Relay Digital Internal Timer (SR-DIT) 553 may begin counting. As it counts, SGSRTD should be working 573.

To stop counting when testing a SM, a DCT 557 and an LMS-NOC 555 may be engaged to cause a stop 559. In turn, a signal should be sent to the DCR-NOC 561 to put the SGG2 and SGG7 in an open position 563. As a result, a stop 565 should occur, causing SR-DIT 553 to stop counting. To reset 569 the SR-DIT, the Stop/Relay Reset 567 may be contacted.

In this specification, "a" and "an" and similar phrases are to be interpreted as "at least one" and "one or more."

Many of the elements described in the disclosed embodiments may be implemented as modules. A module is defined here as an isolatable element that performs a defined function and has a defined interface to other elements. The modules described in this disclosure may be implemented in hardware, software, firmware, wetware (i.e. hardware with a biological element) or a combination thereof, all of which are behaviorally equivalent. For example, modules may be implemented as a software routine written in a computer language (such as C, C++, Fortran, Java, Basic, Python, Matlab or the like) or a modeling/simulation program such as Simulink, Stateflow, or LabVIEW MathScript. Additionally, it may be possible to implement modules using physical hardware that incorporates discrete or programmable analog, digital and/or quantum hardware. Examples of programmable hardware include: computers, microcontrollers, microprocessors, application-specific integrated circuits (ASICs); field programmable gate arrays (FPGAs); and complex programmable logic devices (CPLDs). Computers, microcontrollers and microprocessors are programmed using languages such as assembly, C, C++ or the like. FPGAs, ASICs and CPLDs are often programmed using hardware description languages (HDL) such as VHSIC hardware description language (VHDL) or Verilog that configure connections between internal hardware modules with lesser functionality on a programmable device. Finally, it needs to be emphasized that the above mentioned technologies are often used in combination to achieve the result of a functional module.

The disclosure of this patent document incorporates material which is subject to copyright protection. The copyright owner has no objection to the facsimile reproduction by anyone of the patent document or the patent disclosure, as it appears in the Patent and Trademark Office patent file or records, for the limited purposes required by law, but otherwise reserves all copyright rights whatsoever.

While various embodiments have been described above, it should be understood that they have been presented by way of example, and not limitation. It will be apparent to persons skilled in the relevant art(s) that various changes in form and detail can be made therein without departing from the spirit and scope. In fact, after reading the above description, it will be apparent to one skilled in the relevant art(s) how to implement alternative embodiments. Thus, the present embodiments should not be limited by any of the above described exemplary embodiments. In particular, it should be noted that, for example purposes, the above explanation has focused on the example(s) of estimating the arrival time of a vehicle at a stop. However, one skilled in the art will recognize that embodiments of the invention may be used in other environments, besides railways, to test timers or relays, such as at road traffic signals, airports, ship waterways, ports of entry, etc.

In addition, it should be understood that any figures which highlight the functionality and advantages, are presented for example purposes only. The disclosed architecture is sufficiently flexible and configurable, such that it may be utilized in ways other than that shown. For example, the steps listed in any flowchart may be re-ordered or only optionally used in some embodiments.

Further, the purpose of the Abstract of the Disclosure is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The Abstract of the Disclosure is not intended to be limiting as to the scope in any way.

Finally, it is the applicant's intent that only claims that include the express language "means for" or "step for" be interpreted under 35 U.S.C. 112, paragraph 6. Claims that do not expressly include the phrase "means for" or "step for" are not to be interpreted under 35 U.S.C. 112, paragraph 6.

I claim:

1. A Station Time Grade Time Stop Time and Relay Time Testing Device (SGSRTD) comprising:
   a power switch,
   a first timer,
   a second timer,
   a connector connected to an SGSRTD limit switch connection port,
   a shunt switch, wherein the shunt switch is
      coupled to the first timer with a first shunt connection port, and
      coupled to the second timer with a second shunt connection port, and
   at least one relay.

2. The SGSRTD according to claim 1, wherein the SGSRTD limit switch connection port is
   coupled to the first timer, and
   coupled to the second timer.

3. The SGSRTD according to claim 1, further comprising at least one safety warning device.

4. The SGSRTD according to claim 1, further comprising at least two current transducers.

5. The SGSRTD according to claim 1, further comprising at least one thermal circuit breaker.

6. The SGSRTD according to claim 1, further comprising an AC/DC converter.

7. The SGSRTD according to claim 1, further comprising a wireless network adapter.

8. The SGSRTD according to claim 1, further comprising a data logger.

9. A Station Time Grade Time Stop Time and Relay Time Testing Device (SGSRTD) system comprising:
   a power switch,
   a first timer,
   a second timer,
   a connector connected to an SGSRTD limit switch connection port,
   a limit switch connected to said connector,
   a shunt switch, wherein the shunt switch is
      coupled to the first timer with a first shunt connection port, and
      coupled to the second timer with a second shunt connection port, and
   at least one relay.

10. The SGSRTD system according to claim 9, wherein the SGSRTD limit switch connection port is
   coupled to the first timer, and
   coupled to the second timer.

11. The SGSRTD system according to claim 9, further comprising at least one safety warning device.

12. The SGSRTD system according to claim 9, further comprising at least two current transducers.

13. The SGSRTD system according to claim 9, further comprising at least one thermal circuit breaker.

14. The SGSRTD system according to claim 9, further comprising an AC/DC converter.

15. The SGSRTD system according to claim 9, further comprising a wireless network adapter.

16. The SGSRTD system according to claim 9, further comprising a data logger.

* * * * *